US012154758B2

(12) United States Patent
Shibata et al.

(10) Patent No.: US 12,154,758 B2
(45) Date of Patent: Nov. 26, 2024

(54) OBSERVATION METHOD BY MEANS OF SCANNING TRANSMISSION ELECTRON MICROSCOPE, SCANNING TRANSMISSION ELECTRON MICROSCOPE SYSTEM, AND COMPUTER READABLE MEDIUM

(71) Applicant: The University of Tokyo, Tokyo (JP)

(72) Inventors: Naoya Shibata, Tokyo (JP); Takehito Seki, Tokyo (JP); Kousuke Ooe, Tokyo (JP); Yuichi Ikuhara, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 376 days.

(21) Appl. No.: 17/775,738

(22) PCT Filed: Jun. 11, 2020

(86) PCT No.: PCT/JP2020/023022
§ 371 (c)(1),
(2) Date: May 10, 2022

(87) PCT Pub. No.: WO2021/090528
PCT Pub. Date: May 14, 2021

(65) Prior Publication Data
US 2023/0040811 A1 Feb. 9, 2023

(30) Foreign Application Priority Data
Nov. 8, 2019 (JP) .................. 2019-203552

(51) Int. Cl.
H01J 37/22 (2006.01)
H01J 37/24 (2006.01)
(Continued)

(52) U.S. Cl.
CPC ............ H01J 37/28 (2013.01); H01J 37/222 (2013.01); H01J 37/244 (2013.01);
(Continued)

(58) Field of Classification Search
CPC ........ H01J 37/28; H01J 37/222; H01J 37/244; H01J 37/263; H01J 37/265;
(Continued)

(56) References Cited

U.S. PATENT DOCUMENTS

2012/0187293 A1 7/2012 Shibata et al.
2016/0225580 A1* 8/2016 Kohno ................. H01J 37/222
(Continued)

FOREIGN PATENT DOCUMENTS

JP 2016110878 A 6/2016

OTHER PUBLICATIONS

S. D. Findlay, N. Shibata, H. Sawada, E. Okunishi, Y. Kondo, T. Yamamoto, and Y. Ikuhara, "Robust atomic resolution imaging of light elements using scanning transmission electron microscopy", Appl. Phys. Lett. 95, 191913 (2009) https://doi.org/10.1063/1.3265946.

(Continued)

Primary Examiner — Sean M Luck
(74) Attorney, Agent, or Firm — Fox Rothschild LLP; Carol Thorstad-Forsyth

(57) ABSTRACT

An observation method using a scanning transmission electron microscope for scanning an electron beam over a specimen and detecting electrons transmitted through the specimen includes: acquiring results of detecting the electrons transmitted through the specimen using a segmented detector having detection regions disposed in a bright-field area; and generating segmented images based on the results of detecting the electrons in the detection regions, and applying filters determined based on a signal-to-noise ratio to the segmented images to generate a reconstructed image. The signal-to-noise ratio is proportional to an absolute value of a total phase contrast transfer function normalized by a noise level, the total phase contrast transfer function being (Continued)

defined by product-sum operation of phase contrast transfer functions expressed by complex numbers and weight coefficients for the detection regions. The filters for the detection regions are determined based on the weight coefficients that yield a maximum of the signal-to-noise ratio.

7 Claims, 10 Drawing Sheets

(51) Int. Cl.
    *H01J 37/244*     (2006.01)
    *H01J 37/26*     (2006.01)
    *H01J 37/28*     (2006.01)

(52) U.S. Cl.
    CPC .......... *H01J 37/263* (2013.01); *H01J 37/265* (2013.01); *H01J 2237/223* (2013.01); *H01J 2237/226* (2013.01); *H01J 2237/24465* (2013.01); *H01J 2237/2802* (2013.01)

(58) Field of Classification Search
    CPC ........... H01J 2237/223; H01J 2237/226; H01J 2237/24465; H01J 2237/2802
    See application file for complete search history.

(56) References Cited

U.S. PATENT DOCUMENTS

2016/0254118 A1*   9/2016   Kohno .................. H01J 37/222
                                                250/307
2018/0294136 A1*  10/2018   Kaminer ............... H01J 37/263

OTHER PUBLICATIONS

Pennycook, Timothy J., Lupini, Andrew R., Yang, Hao, Murfitt, Matthew F., Jones, Lewys, & Nellist, Peter D. Efficient phase contrast imaging in STEM using a pixelated detector. Part 1: Experimental demonstration at atomic resolution. United States. https://doi.org/10.1016/j.ultramic.2014.09.013.

Yücelen E, Lazic I, Bosch EGT. Phase contrast scanning transmission electron microscopy imaging of light and heavy atoms at the limit of contrast and resolution. Sci Rep. Feb. 8, 2018;8(1):2676. doi: 10.1038/s41598-018-20377-2. PMID: 29422551; PMCID: PMC5805791.

International Search Report and Written Opinion issued in PCT/JP2020/023022 filed Jun. 11, 2020.

* cited by examiner

Annular Segmented Detector

OBSERVATION METHOD BY MEANS OF SCANNING TRANSMISSION ELECTRON MICROSCOPE, SCANNING TRANSMISSION ELECTRON MICROSCOPE SYSTEM, AND COMPUTER READABLE MEDIUM

CROSS-REFERENCES TO RELATED APPLICATION

This application is a U.S. National Stage entry under 35 U.S.C. § 371 based on International Application No. PCT/JP2020/023022 which was filed on Jun. 11, 2020 and claims priority to Japanese Patent Application No. 2019-203552, which was filed on Nov. 8, 2019 and entitled "OBSERVATION METHOD BY MEANS OF SCANNING TRANSMISSION ELECTRON MICROSCOPE, SCANNING TRANSMISSION ELECTRON MICROSCOPE SYSTEM, AND PROGRAM". The content of the priority applications are hereby incorporated herein in their entirety by reference.

TECHNICAL FIELD

The present invention relates to an observation method by means of a scanning transmission electron microscope, a scanning transmission electron microscope system, and a computer readable medium.

BACKGROUND ART

Scanning transmission electron microscopy (STEM) is known as a method for observing atoms inside materials. STEM is a technique for scanning a highly convergent electron beam (probe) over a specimen and detecting electrons transmitted through and scattered from each point of the specimen by a detector, thereby observing a structure in the specimen. In STEM, high-angle annular dark-field (HAADF) technique for detecting electrons transmitted through and high-angle scattered from a specimen by an annular detector has been actively used. In recent years, annular bright-field (ABF) technique for detecting electrons transmitted through and low-angle scattered from a specimen by an annular detector disposed in a bright-field area has been used (see, for example, Non-Patent Literature 1).

The HAADF technique mainly allows observation of heavy elements in the specimen, and the ABF technique mainly allows observation of light elements in the specimen. In particular, the light elements such as hydrogen (H), lithium (Li), or oxygen (O) act as carriers for storage batteries, fuel cells and other such devices. Therefore, it is extremely important to elucidate influences of dynamics and local structure of the light elements on battery characteristics at an atomic level.

CITATION LIST

Non-Patent Literature

Non-Patent Literature 1: S. D. Findlay, N. Shibata, H. Sawada, E. Okunishi, Y. Kondo, T. Yamamoto, and Y. Ikuhara, "Robust atomic resolution imaging of light elements using scanning transmission electron microscopy" Applied Physics Letters 95, 191913 (2009).

SUMMARY OF INVENTION

Technical Problem

The conventional annular detector detects an average intensity of electron beams over an annular region, and thus information on anisotropy of electron scattering and the like may not be acquired, which leads to limited use of the annular detectors. In addition, because a material containing light elements is vulnerable to electron beam irradiation, the observation by ABF technique is preferably performed under lower electron dose (lower dose) conditions with less irradiation damage. Unfortunately, the lower dose conditions cause decrease in a signal-to-noise ratio (SN ratio) of an image to be obtained. Therefore, a method capable of observing atoms in a specimen with a high contrast even under the lower dose conditions is required.

The invention has been made in view of the foregoing, and an object of the invention is to provide an observation method by means of a scanning transmission electron microscope, a scanning transmission electron microscope system, and a computer readable medium that are capable of observing atoms in a specimen with a high contrast by using a segmented detector having a plurality of detection regions.

Solution to Problem

An observation method according to embodiments of the invention is an observation method by means of a scanning transmission electron microscope for scanning an electron beam over a specimen and detecting electrons transmitted through the specimen to observe a structure in the specimen. The observation method includes: a step of acquiring results of detecting the electrons transmitted through the specimen using a segmented detector having a plurality of detection regions disposed in a bright-field area; and a step of generating a plurality of segmented images based on the results of detecting the electrons in the plurality of detection regions, and applying filters determined based on a signal-to-noise ratio to the plurality of segmented images to generate a reconstructed image. The signal-to-noise ratio is proportional to an absolute value of a total phase contrast transfer function normalized by a noise level, the total phase contrast transfer function being defined by product-sum operation of phase contrast transfer functions expressed by complex numbers and weight coefficients for the plurality of detection regions. The filters for the plurality of detection regions are determined based on the weight coefficients that yield a maximum of the signal-to-noise ratio.

A scanning transmission electron microscope system according to embodiments of the invention is a scanning transmission electron microscope system for scanning an electron beam over a specimen and detecting electrons transmitted through the specimen to observe a structure in the specimen. The scanning transmission electron microscope system includes: an irradiation source configured to generate the electron beam; a convergence device configured to converge the electron beam generated by the irradiation source onto the specimen; a detection unit including a segmented detector having a plurality of detection regions disposed in a bright-field area and configured to detect the electrons transmitted through the specimen for each of the plurality of detection regions; and a computer configured to generate a plurality of segmented images based on results of detecting the electrons in the plurality of detection regions, and apply filters determined based on a signal-to-noise ratio to the plurality of segmented images to generate a reconstructed image. The signal-to-noise ratio is proportional to an absolute value of a total phase contrast transfer function normalized by a noise level, the total phase contrast transfer function being defined by product-sum operation of phase contrast transfer functions expressed by complex numbers and weight coefficients for the plurality of detection regions.

The filters for the plurality of detection regions are determined based on the weight coefficients that yield a maximum of the signal-to-noise ratio.

A computer readable medium according to embodiments of the invention is a computer readable medium for executing an observation method by means of a scanning transmission electron microscope. The program causes a computer to execute: a step of acquiring results of detecting electrons transmitted through a specimen using a segmented detector having a plurality of detection regions disposed in a bright-field area; and a step of generating a plurality of segmented images based on the results of detecting the electrons in the plurality of detection regions, and applying filters determined based on a signal-to-noise ratio to the plurality of segmented images to generate a reconstructed image. The signal-to-noise ratio is proportional to an absolute value of a total phase contrast transfer function normalized by a noise level, the total phase contrast transfer function being defined by product-sum operation of phase contrast transfer functions expressed by complex numbers and weight coefficients for the plurality of detection regions. The filters for the plurality of detection regions are determined based on the weight coefficients that yield a maximum of the signal-to-noise ratio.

Advantageous Effects of Invention

According to the invention, a plurality of segmented images is generated based on results of detecting electrons in a plurality of detection regions constituting a segmented detector, and filters are applied to the plurality of segmented images to generate a reconstructed image. The filters are determined based on weight coefficients that yield a maximum of a signal-to-noise ratio. With this feature, it is possible to observe atoms in a specimen with a high contrast.

DESCRIPTION OF EMBODIMENTS

Embodiments of the invention will be described below with reference to the drawings. The same reference signs are used to designate the same or similar elements throughout the drawings. The drawings are schematic, and a correlation between a plane dimension and a thickness and a ratio of the thicknesses of the members are different from actual ones. As a matter of course, those having portions having different dimensional correlations and ratios between the drawings are included as well.

System Configuration

First, a system configuration of the embodiments will be described.

Figure 1:
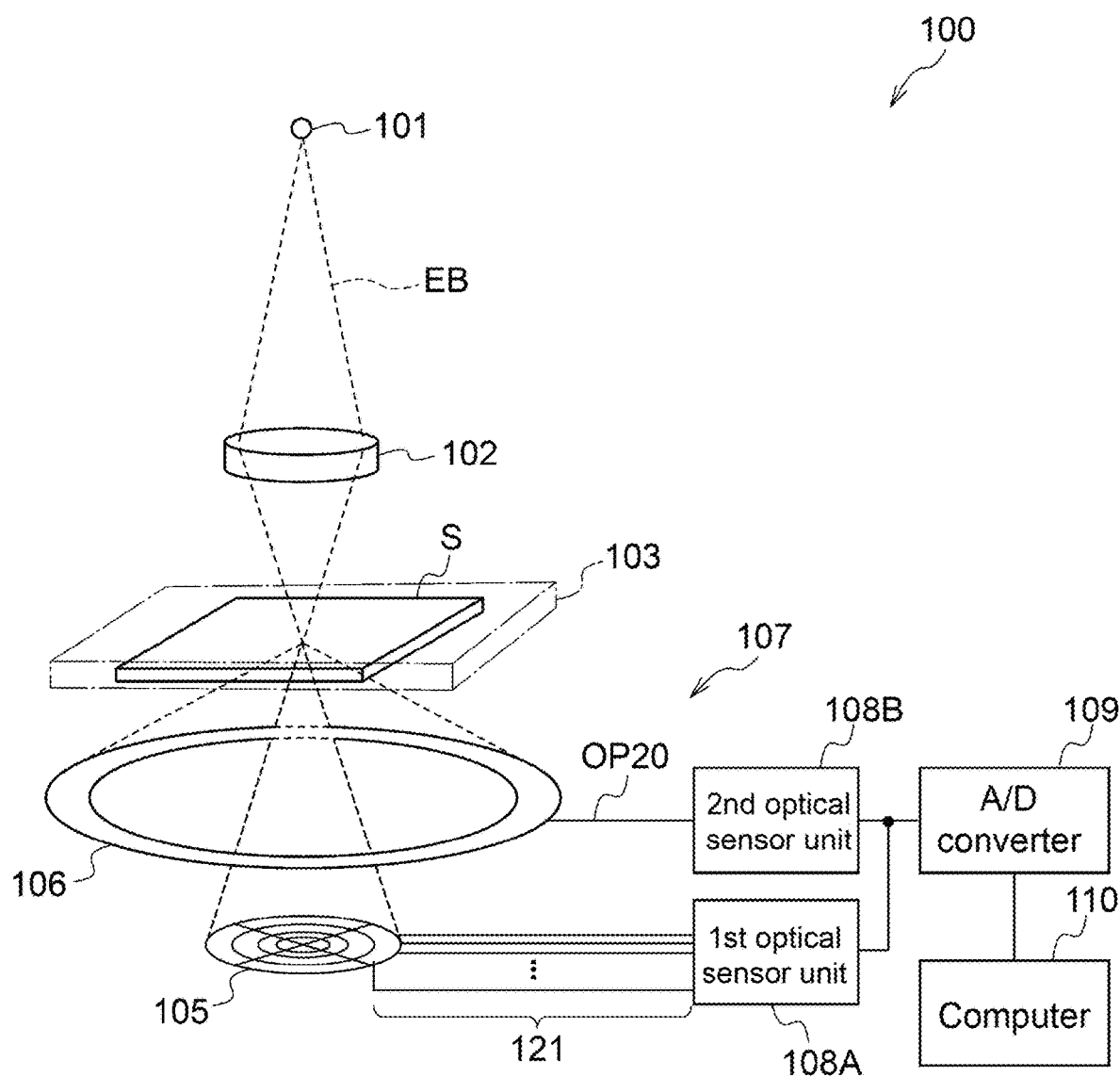
FIG. 1 is a schematic diagram illustrating a main configuration of a scanning transmission electron microscope system according to embodiments.

FIG. 1 illustrates a main configuration of a scanning transmission electron microscope system 100 according to the embodiments. As shown in FIG. 1, the scanning transmission electron microscope system 100 is a system that executes STEM imaging, and includes an irradiation source 101, a convergence lens 102, a specimen holder 103, a detection unit 107, an A/D converter 109, and a computer 110. The detection unit 107 includes a segmented detector 105, a dark-field detector 106, a first optical sensor unit 108A, and a second optical sensor unit 108B.

Figure 2:
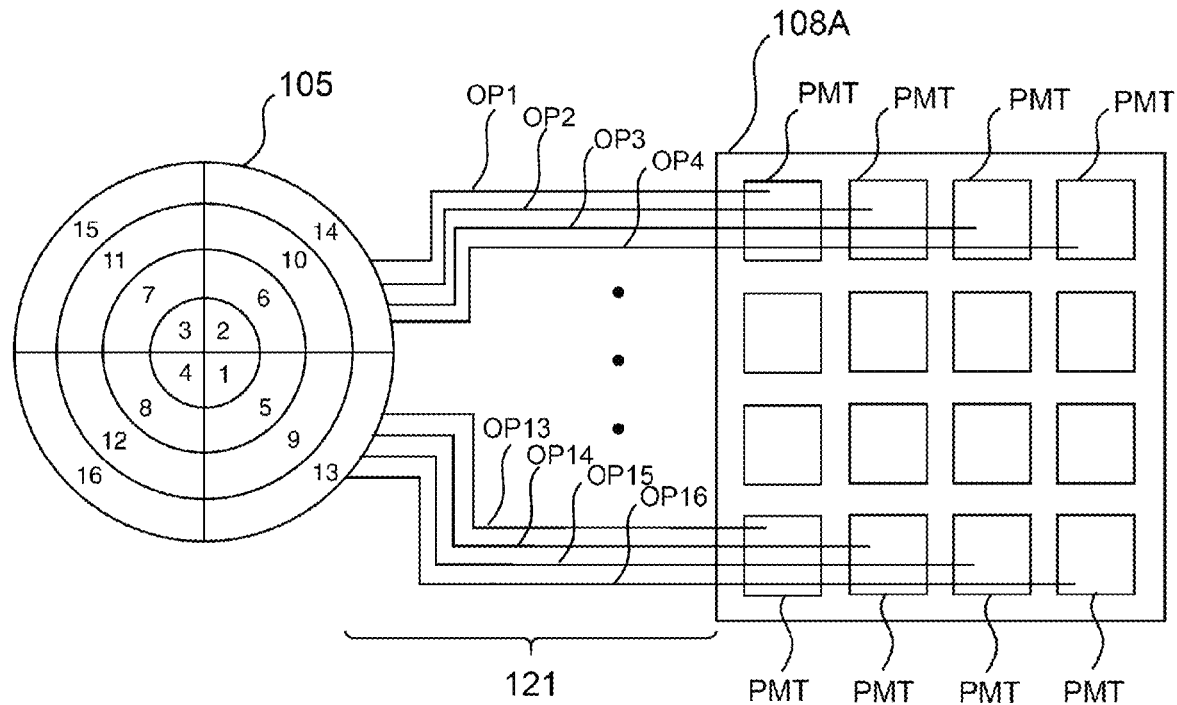
FIG. 2 is a schematic diagram illustrating a connection between a segmented detector and a first optical sensor unit shown in FIG. 1.

The segmented detector 105 is connected to the first optical sensor unit 108A via an optical fiber bundle 121, and the dark-field detector 106 is connected to the second optical sensor unit 108B via an optical fiber OP20. As shown in FIG. 2, the optical fiber bundle 121 includes optical fibers OP1 to OP16. The first optical sensor unit 108A and the second optical sensor unit 108B are connected to the A/D converter 109, and the A/D converter 109 is connected to the computer 110.

The irradiation source 101 includes an electron gun, and generates an electron beam EB by accelerating electrons emitted from a cathode by an anode.

The convergence lens 102 is disposed on a downstream side of the irradiation source 101, and is a convergence device that converges the electron beam EB generated by the irradiation source 101 onto a specimen S in the specimen holder 103.

The specimen holder 103 holds the specimen S for observation and positions the specimen S.

The segmented detector 105 is a disk-shaped detector disposed in a bright-field area, and detects electrons transmitted through and low-angle scattered from the specimen S. As shown in FIG. 2, the segmented detector 105 includes 16 fan-shaped detection regions 1 to 16 obtained by segmenting a circle into four in a radial direction and segmenting the circle into four in an azimuthal direction. The detection regions 1 to 16 are connected to the first optical sensor unit 108A via the optical fibers OP1 to OP16, respectively.

Each of the detection regions 1 to 16 includes a scintillator on a detection surface, and converts a signal of the electrons scattered from the specimen S into an optical signal by the scintillator. The optical signals acquired by the scintillators of the detection regions 1 to 16 are output to the first optical sensor unit 108A via the optical fibers OP1 to OP16, respectively.

The number of the detection regions constituting the segmented detector 105 may be any number of two or more, and is not particularly limited. A shape of each detection region can be designed freely.

The dark-field detector 106 is a HAADF detector that detects electrons transmitted through and high-angle scattered from the specimen S. The dark-field detector 106 includes a scintillator on a detection surface, and converts a signal of the electrons scattered from the specimen S into an optical signal by the scintillator. The optical signal acquired by the dark-field detector 106 is output to the second optical sensor unit 108B via the optical fiber OP20.

As shown in FIG. 2, the first optical sensor unit 108A includes 16 photomultiplier tubes (PMTs) corresponding to the detection regions 1 to 16 of the segmented detector 105, respectively. The 16 PMTs are connected to the optical fibers OP1 to OP16, respectively. Each PMT performs photoelectric conversion and amplification processing on the optical signal input via the corresponding optical fiber to obtain an electrical signal, and outputs the electrical signal (analog signal) to the A/D converter 109.

The second optical sensor unit 108B includes a PMT, performs photoelectric conversion and amplification processing on the optical signal input from the dark-field detector 106 via the optical fiber OP20 to obtain an electrical signal, and outputs the electrical signal (analog signal) to the A/D converter 109.

The A/D converter 109 converts the electrical signal output from each PMT of the first optical sensor unit 108A and the electrical signal output from the PMT of the second optical sensor unit 108B into digital signals, and outputs these digital signals to the computer 110.

Figure 3:
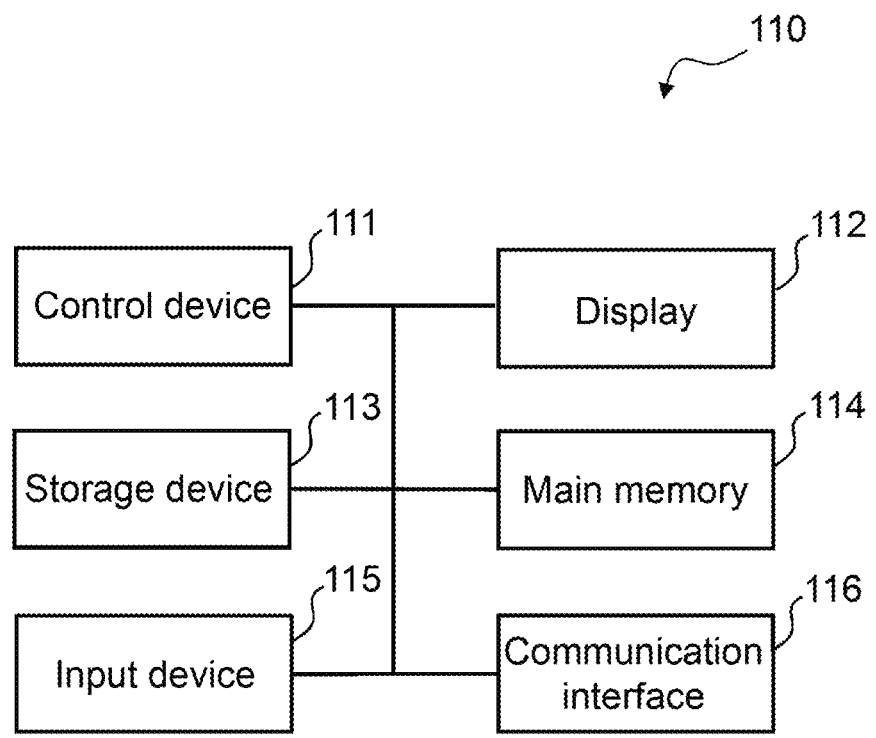
FIG. 3 is a schematic diagram illustrating a configuration of a computer for executing an observation method according to the embodiments.

As shown in FIG. 3, the computer 110 includes a control device 111, a display 112, a storage device 113, a main memory 114, an input device 115, and a communication interface 116, and these devices are connected to each other via a bus.

The control device 111 includes a central processing unit (CPU), and executes an observation method described later (see FIGS. 4 and 7 to 9) based on detection results obtained by the detection unit 107 via the A/D converter 109 in accordance with a program stored in the storage device 113.

The display 112 is a display such as a liquid crystal display (LCD), a plasma display, or an organic electroluminescence (EL) display, and displays results obtained by the observation method executed by the control device 111.

The storage device 113 is a non-volatile memory, and stores various programs executed by the control device 111 and data necessary for executing these programs.

The main memory 114 is a volatile memory. The programs and data stored in the storage device 113 are loaded into the main memory 114 and executed.

The programs executed by the control device 111 and the data necessary for executing these programs may be recorded in a non-transitory computer-readable recording medium (such as a memory card) that is detachable from the computer 110, or may be received from a network via the communication interface 116.

The input device 115 is an input device such as a keyboard, a mouse, or a touch panel, and receives an input operation by a user.

The communication interface 116 is an interface for transmitting and receiving data to and from an external device via a network such as a local area network (LAN), a wide area network (WAN), or the Internet.

As for the control device 111, instead of general-purpose hardware such as CPU, dedicated hardware for executing the observation method of the embodiments may be employed, such as an application specific integrated circuit (ASIC) or a field programmable gate array (FPGA).

Observation Method by Means of Scanning Transmission Electron Microscope

Next, an observation method by means of a scanning transmission electron microscope of the embodiments (STEM imaging) will be described in detail with reference to FIGS. 4 to 10.

(I) Observation Method by Frequency Filtering

First, an observation method by frequency filtering according to the embodiments will be described with reference to FIGS. 4 to 6.

Figure 4:
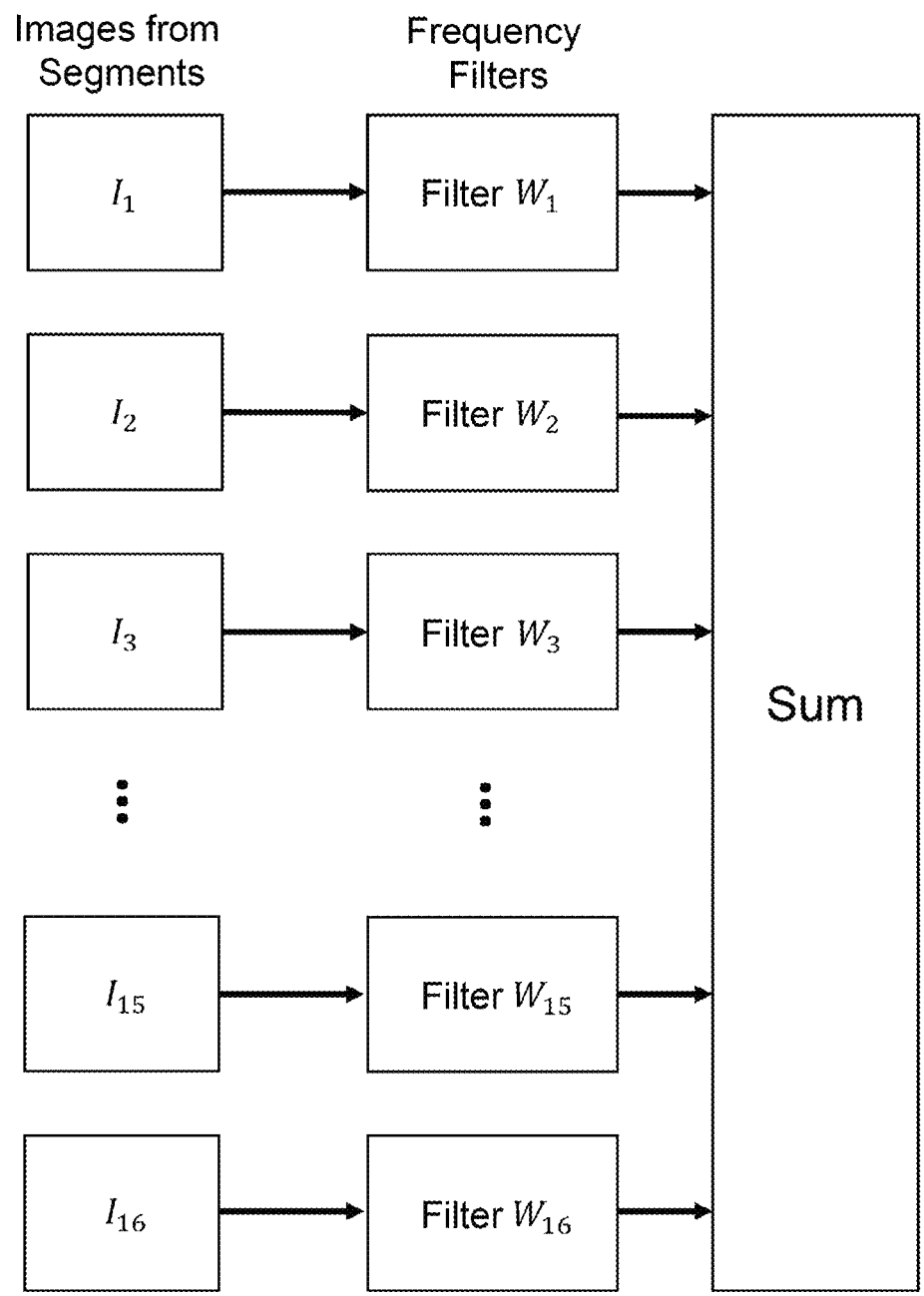
FIG. 4 is a schematic diagram illustrating an observation method by frequency filtering.

In the observation method by frequency filtering, as shown in FIG. 4, frequency filters (with weights $W_1$ to $W_{16}$) are applied to STEM images (which are segmented images having intensities $I_1$ to $I_{16}$) simultaneously acquired from the detection regions 1 to 16 of the segmented detector 105, and the resultant signals are added up to reconstruct one STEM image. In order to form an image of atoms in the specimen S with a high contrast, it is necessary to design optimum frequency filters for detection regions of the segmented detector 105 as will be described in detail below.

The following will first describe STEM imaging under weak phase object approximation (hereinafter referred to as a "WPOA") which is valid if the specimen S is sufficiently thin. Thereafter, STEM imaging under thick WPOA (hereinafter referred to as tWPOA) in consideration of the specimen S with a finite thickness will be described.

Under WPOA, the specimen S is assumed to be projected in an incident direction of the electron beam EB and treated two-dimensionally, and propagation of the electrons inside the specimen S is assumed to be negligible. Such an approximation is established when the thickness of the specimen S is sufficiently smaller than a depth of field $\Delta z$ of a probe (convergent electron beam). The depth of field $\Delta z$ is equal to $\lambda/\alpha^2$, where $\lambda$ and $\alpha$ denote a wavelength and a convergence semi-angle of the electron beam EB, respectively. The sufficiently thin specimen S treated under WPOA includes two-dimensional materials with a thickness of several layers of atoms, such as graphene.

In the STEM imaging, the segmented detector 105 detects an intensity $I(k, R_p)$ of a diffraction pattern of the electron beam EB, where k denotes two-dimensional reciprocal space coordinates on a surface of the segmented detector 105, and $R_p$ denotes a probe position in real space.

Under WPOA, Fourier transform of the intensity $I(k, R_p)$ at the probe position $R_p$ yields a Fourier image $G(k, Q_p)$ at a spatial frequency $Q_p$ as given by Equation (1).

$$G(k, Q_p) = \mathcal{F}_{R_p \to Q_p}[I(k, R_p)] \quad (1)$$
$$= |T(k)|^2 \delta(Q_p) + i[T^*(k)T(k-Q_p) - T(k)T^*(k+Q_p)]\sigma V_p(Q_p)$$

Here, * indicates a complex conjugate.

T(k) in Equation (1) denotes a lens transfer function indicating an amplitude and a phase of incident electrons in the reciprocal space, and is expressed as in Equation (2).

$$T(k) = A(k)\exp(-i\chi(k)) \quad (2)$$

A(k) in Equation (2) denotes an aperture function given by Equation (3).

$$A(k) = \begin{cases} A_0 & |k| < k_0 \\ 0 & \text{otherwise} \end{cases} \quad (3)$$

Here, $k_0$ denotes a radius of the aperture function in the reciprocal space, and $A_0$ denotes a normalization constant satisfying the following Equation (4).

$$\int |A(k)|^2 dk = 1 \quad (4)$$

The radius of the aperture function is expressed by the convergence semi-angle $\alpha$, and satisfies $\alpha = \lambda k_0$.

$\chi(k)$ in Equation (2) denotes an aberration function given by Equation (5).

$$\chi(k) = -\pi\lambda\Delta f|k|^2 \quad (5)$$

Here, $\Delta f$ denotes a defocus (out-of-focus) value. In general, aberrations other than the defocus also remains, and various terms appear in $\chi(k)$ depending on types of the aberrations. However, all the aberrations except for the defocus are assumed to be corrected in theoretical derivation of the STEM imaging of the embodiments.

$V_p(Q_p)$ in Equation (1) denotes a projected potential of the specimen S in the reciprocal space, and depends on species of atoms constituting the specimen S, and a structure and an observation orientation of the atoms. $V_p(Q_p)$ is obtained by performing Fourier transform on a projected potential of the specimen S in the real space.

$\sigma$ in Equation (1) denotes an interaction constant given by Equation (6).

$$\sigma = \frac{2\pi m e \lambda}{h^2} \quad (6)$$

Here, h denotes the Planck constant, m denotes a relativistic mass of an electron, and e denotes an elementary charge of an electron. m and $\lambda$ are variables depending on an accelerating voltage. In electron microscope observation, because the accelerating voltage is set depending on the purposes, a value of o changes according to the accelerating voltage (for example, 200 kV, 80 kV, or the like), but is constant under the same observation condition.

When the segmented detector 105 includes N detection regions, an intensity $I_i(R_p)$ in the real space of the STEM image (segmented image) generated based on a detection result in an i-th (i=1, 2, ..., N) detection region is given by Equation (7).

$$I_i(R_p) = \int I(k, R_p) D_i(k) dk \quad (7)$$

$D_i(k)$ in Equation (7) denotes a detector response function of the i-th detection region, and returns 1 inside the i-th detection region and returns 0 outside the i-th detection region, as expressed in Equation (8).

$$D_i(k) = \begin{cases} 1 & \text{inside } i\text{-th segment region} \\ 0 & \text{otherwise} \end{cases} \quad (8)$$

Fourier transform of the intensity $I_i(R_p)$ yields a Fourier image $G_i(Q_p)$ at the spatial frequency $Q_p$ as given by Equation (9).

$$G_i(Q_p) = \mathcal{F}_{R_p \to Q_p}[I_i(R_p)] \quad (9)$$
$$= \int G(k, Q_p) D_i(k) dk$$
$$= \delta(Q_p) d_i + \sigma V_p(Q_p) \beta_i(Q_p)$$

$d_i$ in Equation (9) denotes a background intensity of the i-th STEM image (which is an intensity when the electron beam EB is irradiated in vacuum without the specimen S), and is given by Equation (10).

$$d_i = \int |T(k)|^2 D_i(k) dk \quad (10)$$

$\beta_i(Q_p)$ in Equation (9) denotes a phase contrast transfer function (hereinafter referred to as a PCTF) for the i-th detection region, and is defined as a function of the spatial frequency $Q_p$ as in Equation (11).

$$\beta_i(Q_p) = i\int [T^*(k)T(k-Q_p) - T(k)T^*(k+Q_p)] D_i(k) dk \quad (11)$$

The PCTF is expressed by a complex number, and indicates how a Fourier component of a phase given by the projected potential is transferred from the i-th detection region to the image (that is, behavior of a contrast of the STEM image). The PCTF is uniquely determined from STEM observation conditions such as the accelerating voltage (kV) of the electron beam EB, the convergence semi-angle (mrad), and shapes and arrangements of the detection regions of the segmented detector 105, but is independent of the specimen S.

Phase information can be efficiently obtained by adding up the intensities $I_1(R_p), I_2(R_p), \ldots, I_N(R_p)$ of the STEM images obtained from the detection regions. In the embodiments, however, the intensities of the STEM images are added up via the frequency filters. Specifically, as expressed in Equation (12), a total Fourier image $G_{tot}(Q_p)$ is obtained by performing product-sum operation of $G_i(Q_p)$ and a weight coefficient (which is the frequency filter of the i-th STEM image) $W_i(Q_p)$ for each detection region.

$$G_{tot}(Q_p) = \sum_{i=1}^{N} W_i(Q_p) G_i(Q_p) \quad (12)$$
$$= \delta(Q_p) \sum_{i=1}^{N} W_i(Q_p) d_i + \sigma V_p(Q_p) \sum_{i=1}^{N} W_i(Q_p) \beta_i(Q_p)$$

Here, as in Equation (13), a total PCTF $\beta_{tot}(Q_p)$ is defined by product-sum operation of the PCTF $\beta_i(Q_p)$ and the weight coefficient $W_i(Q_p)$ for the i-th detection region.

$$\beta_{tot}(Q_p) = \sum_{i=1}^{N} W_i(Q_p)\beta_i(Q_p) \tag{13}$$

In order to determine an optimal weight condition for high-contrast imaging, first, a noise level (noise intensity) $N_{tot}(Q_p)$ is defined by Equation (14).

$$N_{tot}(Q_p) = \sqrt{\int |T(k)|^2 \left|\sum_{i=1}^{N} W_i(Q_p)D_i(k)\right|^2 dk} \tag{14}$$

$$= \sqrt{\sum_{i=1}^{N} |W_i(Q_p)|^2 d_i}$$

From Equation (12) to Equation (14), a signal-to-noise ratio (SN ratio) $G_{tot}(Q_p)/N_{tot}(Q_p)$ at the spatial frequency $Q_p$ is expressed as in Equation (15).

$$\frac{G_{tot}(Q_p)}{N_{tot}(Q_p)} = \frac{\beta_{tot}(Q_p)}{N_{tot}(Q_p)}\sigma V_p(Q_p) = \frac{\sum_{i=1}^{N} W_i(Q_p)\beta_i(Q_p)}{\sqrt{\sum_{i=1}^{N} |W_i(Q_p)|^2 d_i}}\sigma V_p(Q_p) \tag{15}$$

This makes it possible to obtain the weight coefficient $W_i(Q_p)$ that yields a maximum of a PCTF noise ratio $|\beta_{tot}(Q_p)|/N_{tot}(Q_p)$ at each spatial frequency $Q_p$, the PCTF noise ratio being an absolute value of the total PCTF normalized by the noise level. By applying the Cauchy-Schwarz inequality to Equation (15), Formula (16) is established.

$$\frac{|\beta_{tot}(Q_p)|}{N_{tot}(Q_p)} \leq \sqrt{\sum_{i=1}^{N} \frac{|\beta_i(Q_p)|^2}{d_i}} \tag{16}$$

A condition for maximizing a left-hand side of Formula (16) is given by Equation (17).

$$W_i(Q_p) = K(Q_p)\frac{\beta_i^*(Q_p)}{d_i} \tag{17}$$

Here, $K(Q_p)$ denotes an arbitrary function determined by the spatial frequency $Q_p$. From Equation (17), the weight coefficient $W_i(Q_p)$ that yields the maximum of the SN ratio can be uniquely determined based on the complex conjugate of the PCTF and the background intensity (background level) for each detection region. The weight coefficient $W_i(Q_p)$ is found to be determined based on the STEM observation conditions but to be independent of the specimen S.

Equation (17) shows that the weight coefficient $W_i(Q_p)$ that maximizes the SN ratio is proportional to the complex conjugate of the PCTF, and is inversely proportional to the background level. This indicates that the weight is set to be small when the background level is large and the noise is significant, and conversely, the weight is set to be large as the PCTF increases.

By performing inverse Fourier transform on the total Fourier image $G_{tot}(Q_p)$ after substituting Equation (17) into Equation (12), an intensity $I_{tot}(R_p)$ of the reconstructed STEM image is obtained as given by Equation (18).

$$I_{tot}(R_p) = \mathcal{F}_{Q_p \to R_p}^{-1}[G_{tot}(Q_p)] \tag{18}$$

The STEM imaging under the above WPOA can be extended to the STEM imaging under tWPOA as described below. Under tWPOA, the thickness of the specimen S is larger than the depth of field $\Delta z$ of the probe (for example, $\Delta z = 3.7$ nm at the accelerating voltage of 120 kV and the convergence semi-angle of 30 mrad), and thus the effects of the propagation of the electrons inside the specimen S should be considered.

Under tWPOA, the specimen S with a finite thickness is assumed to contain a large number of slices, and the contrast of the STEM image is assumed to be expressed by a sum (integral) of a contrast of each slice. Assuming that the thickness of each slice is sufficiently smaller than the depth of field $\Delta z$ of the probe and the slices share the same projected potential, an integrated phase contrast transfer function (integrated PCTF) (hereinafter referred to as an iPCTF) indicating the behavior of the contrast of the STEM image under tWPOA is obtained by integrating a conventional PCTF for each slice over z.

That is, when the thickness of the specimen S is denoted by t, an iPCTF $\beta^{thick}(Q_p)$ is expressed as in Equation (19).

$$\beta^{thick}(Q_p) = \frac{1}{t}\int_{\Delta f}^{\Delta f + t} \beta(Q_p; z)dz \tag{19}$$

Here, an integrand $\beta(Q_p; z)$ denotes a conventional PCTF for a slice at a position z in a thickness direction of the specimen S with respect to a focal plane of the convergent electron beam EB, and $\Delta f$ denotes a defocus value for a surface of the specimen S.

An aberration function $\chi(k)$ in $\beta(Q_p; z)$ is given by Equation (20).

$$\chi(k;z) = \pi\lambda z|k|^2 + \chi_0(k) \tag{20}$$

The first term on a right-hand side of Equation (20) indicates a defocus aberration for the slice in the specimen S, and the second term $\chi_0(k)$ indicates a lens aberration other than the defocus.

By replacing the PCTF $\beta_i(Q_p)$ in Equation (9) to Formula (16) with the iPCTF $\beta_i^{thick}(Q_p)$ for the i-th detection region, a weight coefficient $W_i^{thick}(Q_p)$ that yields a maximum of the SN ratio under tWPOA is given by Equation (21).

$$W_i^{thick}(Q_p) = K(Q_p)\frac{\beta_i^{thick*}(Q_p)}{d_i} \tag{21}$$

By replacing $\beta_i(Q_p)$ and $W_i(Q_p)$ in Equation (12) with $\beta_i^{thick}(Q_p)$ and $W_i^{thick}(Q_p)$ in Equation (21), respectively, a total Fourier image $G_{tot}^{thick}(Q_p)$ is obtained. By performing inverse Fourier transform on the $G_{tot}^{thick}(Q_p)$, an intensity $I_{tot}^{thick}(R_p)$ of the reconstructed STEM image under tWPOA is obtained as in Equation (22).

$$I_{tot}^{thick}(R_p) = \mathcal{F}_{Q_p \to R_p}^{-1}[G_{tot}^{thick}(Q_p)] \tag{22}$$

Figure 5:
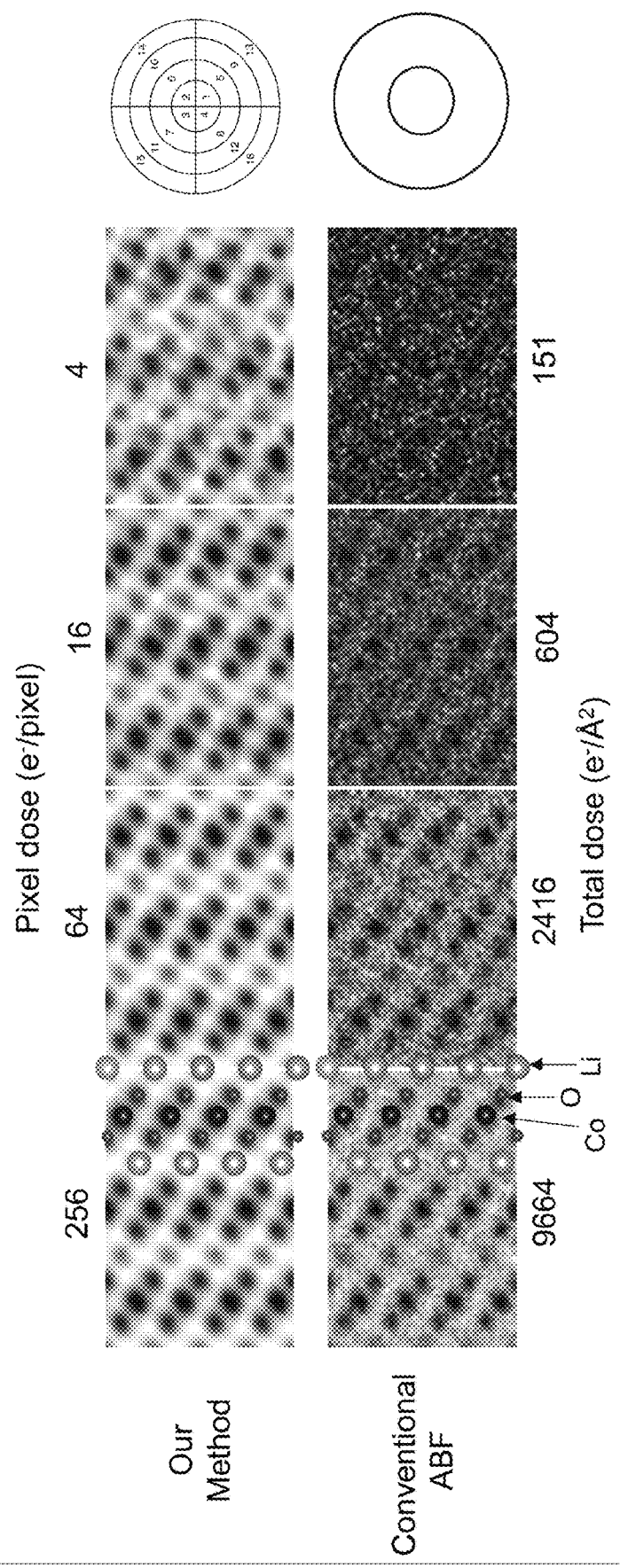
FIG. 5 is an example of simulation results of the observation method by frequency filtering and a conventional annular bright-field technique.

FIG. 5 shows simulation images obtained by the observation method by frequency filtering of the embodiments (Our Method) and simulation images obtained by a conventional ABF technique, in different dose amounts, when $LiCoO_2$ having a layered structure in the specimen S is viewed from a direction orthogonal to a stacking direction (viewed from [010] direction in Miller index notation).

Specifically, the dose amounts in the simulation results are 256 e–/pixel=9664 e–/Å$^2$, 64 e–/pixel=2416 e–/Å$^2$, 16 e–/pixel=604 e–/Å$^2$, and 4 e–/pixel=151 e–/Å$^2$. Here, the thickness of the specimen S is 10 nm when viewed from an observation direction, the accelerating voltage is 120 kV, and the convergence semi-angle is 30 mrad. Shot noise corresponding to each dose amount is introduced into each image.

As shown in FIG. 5, when the dose amount is large and the noise is small, lithium (Li), oxygen (O), and cobalt (Co) are visualized in both the observation method of the embodiments and the conventional ABF technique. With a decrease in the dose amount, the SN ratio is lowered, and the conventional ABF technique makes it difficult to visualize the atoms. In contrast, the observation method of the embodiments makes it possible to visualize lithium (Li) columns even under lower dose conditions.

Figure 6:
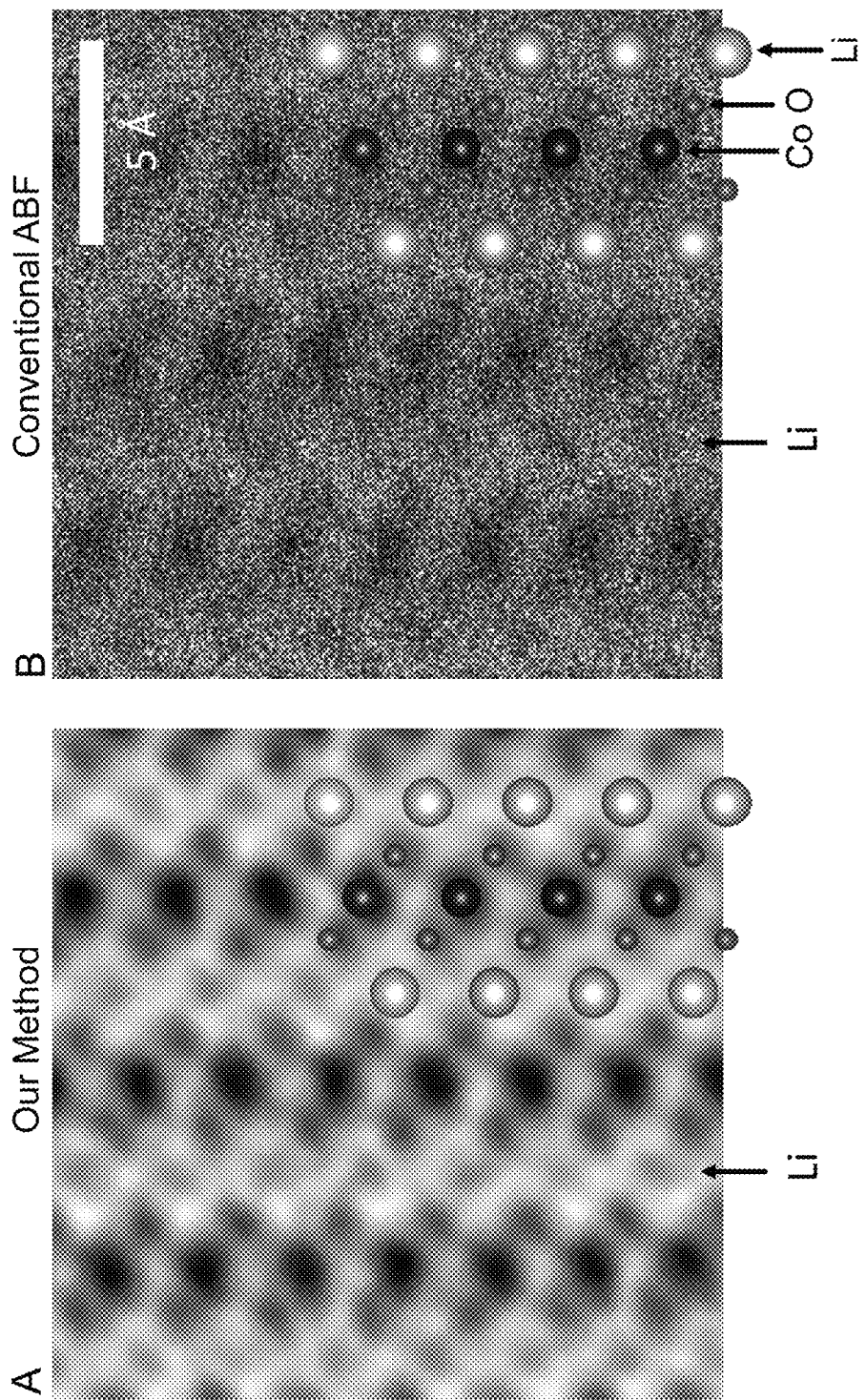
FIG. 6 is an example of experimental results of the observation method by frequency filtering and the conventional annular bright-field technique.

FIG. 6 shows STEM images A and B acquired in experiments under a lower dose condition (about 275 e–/pixel) with less irradiation damage, using the observation method by frequency filtering of the embodiments (Our Method) and the conventional ABF technique, respectively. Here, the thickness of the specimen S is 10 nm when viewed from the observation direction, the accelerating voltage is 120 kV, and the convergence semi-angle is 30 mrad. In FIG. 6, a white scale bar shown on an upper right side of the STEM image B corresponds to 5 Å. FIG. 6 confirms that lithium (Li) columns, which are difficult to be identified using the ABF technique, are clearly visualized even under the lower dose condition using the observation method of the embodiments.

(II) Observation Method by Real-Space Filtering

Next, an observation method by real-space filtering according to the embodiments will be described with reference to FIGS. 7 to 9.

Figure 7:
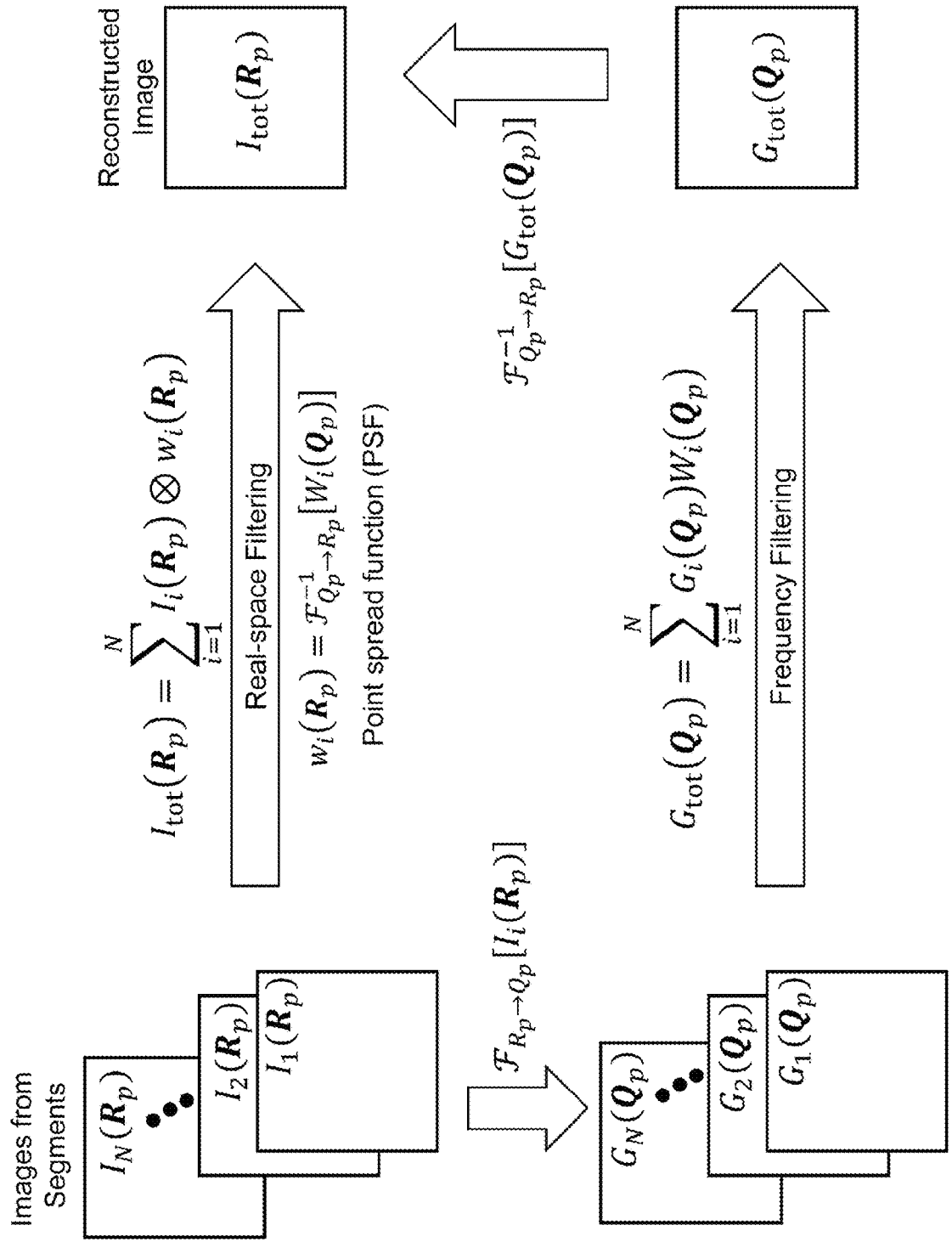
FIG. 7 is a schematic diagram of comparison between an observation method by real-space filtering and the observation method by frequency filtering.
Figure 8:
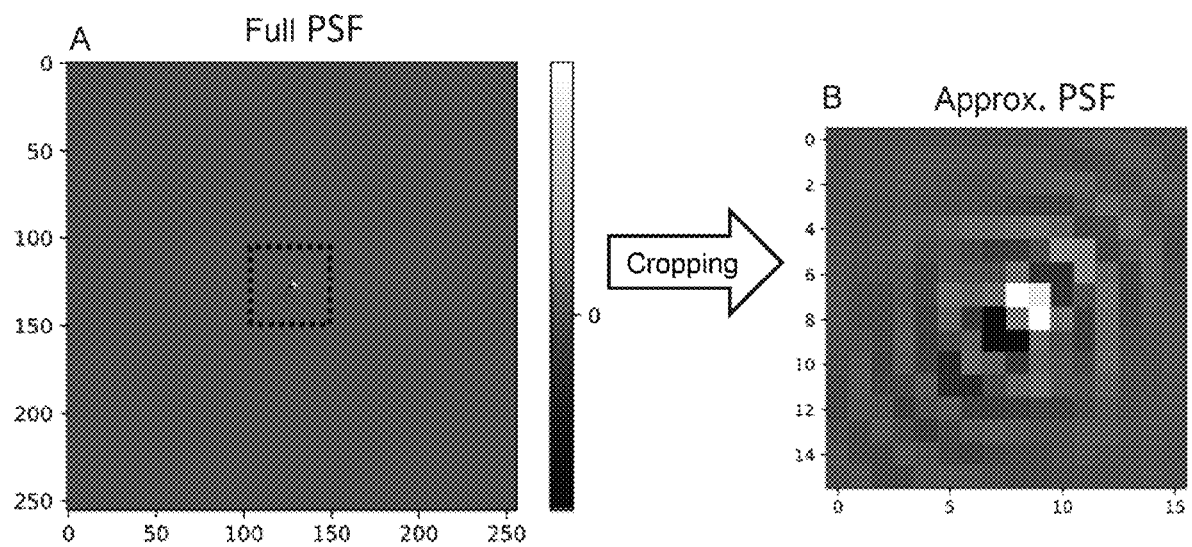
FIG. 8 is a schematic diagram illustrating a full point spread function and an approximate point spread function for one detection region.

In the above observation method by frequency filtering, as shown in FIG. 7, Fourier transform is performed on the STEM images (intensity $I_i(R_p)$) simultaneously acquired from the detection regions of the segmented detector 105 to obtain Fourier images $G_i(Q_p)$, product-sum operation of $G_i(Q_p)$ and the frequency filter (weight coefficient) $W_i(Q_p)$ is performed to obtain the total Fourier image $G_{tot}(Q_p)$, and inverse Fourier transform is performed on $G_{tot}(Q_p)$ to obtain the reconstructed STEM image (intensity $I_{tot}(R_p)$) in the real space. That is, since the frequency filters are applied after all the STEM images are acquired from the detection regions, the frequency filtering and the STEM image reconstruction are performed as post-processing.

In observation of a specimen S which is vulnerable to irradiation with the electron beam EB, it is preferable to adjust an optical system such as aberration and adjust observation conditions in real time while scanning over the specimen S in order to prevent irradiation damage. To execute such real-time processing, in the observation method by real-space filtering, the intensity $I_{tot}(R_p)$ of the reconstructed STEM image is defined by Equation (23).

$$I_{tot}(R_p) = \sum_{i=1}^{N} I_i(R_p) \otimes w_i(R_p) \quad (23)$$

In Equation (23), a circled multiplication symbol denotes a convolution operator. $I_{tot}(R_p)$ is defined as inverse Fourier transform of the total Fourier image $G_{tot}(Q_p)$ at the spatial frequency $Q_p$, as with Equation (18). $w_i(R_p)$ denotes a point spread function (hereinafter referred to as a PSF) as a real-space filter, and is defined as inverse Fourier transform of the frequency filter (weight coefficient) $W_i(Q_p)$ at the spatial frequency $Q_p$ as given by Equation (24).

$$w_i(R_p) = \mathcal{F}_{Q_p \to R_p}^{-1}[W_i(Q_p)] \quad (24)$$

As described above, as shown in FIG. 7, the observation method using real-space filtering is a process in the real space without Fourier transform unlike the above frequency filtering. That is, by convolving the STEM image in the real space obtained from each detection region with the PSF as the real-space filter and adding up the resultant images, the reconstructed STEM image is obtained. This technique gives equivalent results to those obtained using the above frequency filtering processing (post-processing).

The number of sampling pixels of the frequency filter $W_i(Q_p)$ or the PSF $w_i(R_p)$ in Equation (24) is the same as the number of pixels of the STEM image (intensity $I_i(R_p)$) obtained from the i-th detection region. For example, if the STEM image obtained from each detection region is sampled with 256×256 pixels (256 pixels square), the PSF $w_i(R_p)$ also has 256×256 pixels (256 pixels square). Therefore, if this PSF $w_i(R_p)$ is used, the STEM image reconstruction cannot be achieved unless the entire STEM image (for example, 256×256 pixels) is acquired.

Here, the probe has a shape that is most convergent in the real space on the focal plane (Δf=0). The probe used for high-resolution observation is set such that Δf is almost zero or a very tiny value, and thus the PSF value is localized near the origin. Therefore, as shown in A of FIG. 8, most components of a full PSF for one detection region are zero except near the origin. Taking advantage of this property, as shown in A and B of FIG. 8, an approximate point spread function (approximate PSF) with a small size can be defined by cropping the full PSF, thereby approximating Equation (23) using only the approximate PSF and a part of $I_i(R_p)$. FIG. 8 shows an example of cropping the full PSF of 256 pixels square into the approximate PSF of 16 pixels square, but the size of the full PSF and the size of the approximate PSF are not particularly limited.

Figure 9:
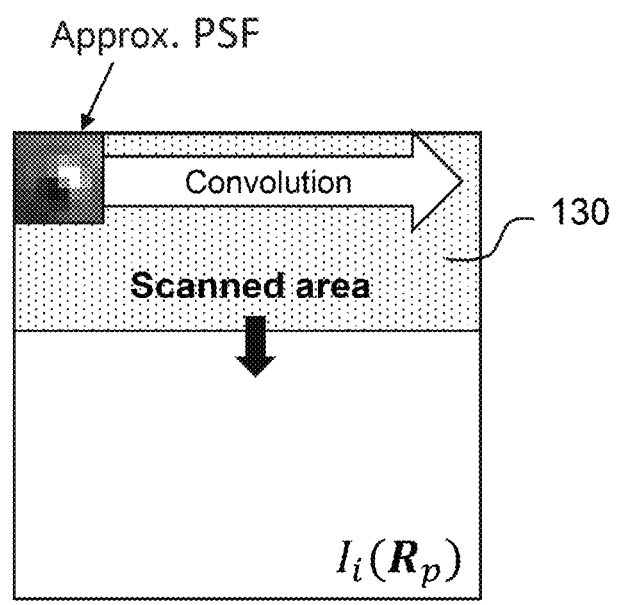
FIG. 9 is a schematic diagram illustrating real-space filtering by convolution using the approximate point spread function.

As shown in FIG. 9, the STEM image (intensity $I_i(R_p)$) for the i-th detection region is acquired by scanning for each predetermined number of lines (for example, line by line). By convolving a scanned area 130 of the STEM image with the approximate PSF, the reconstructed image can be generated while scanning over the specimen S even when the entire STEM image is not acquired. With this real-time processing, it is also possible to adjust the optical system such as aberration and adjust the observation conditions while scanning over the specimen S.

Figure 10:
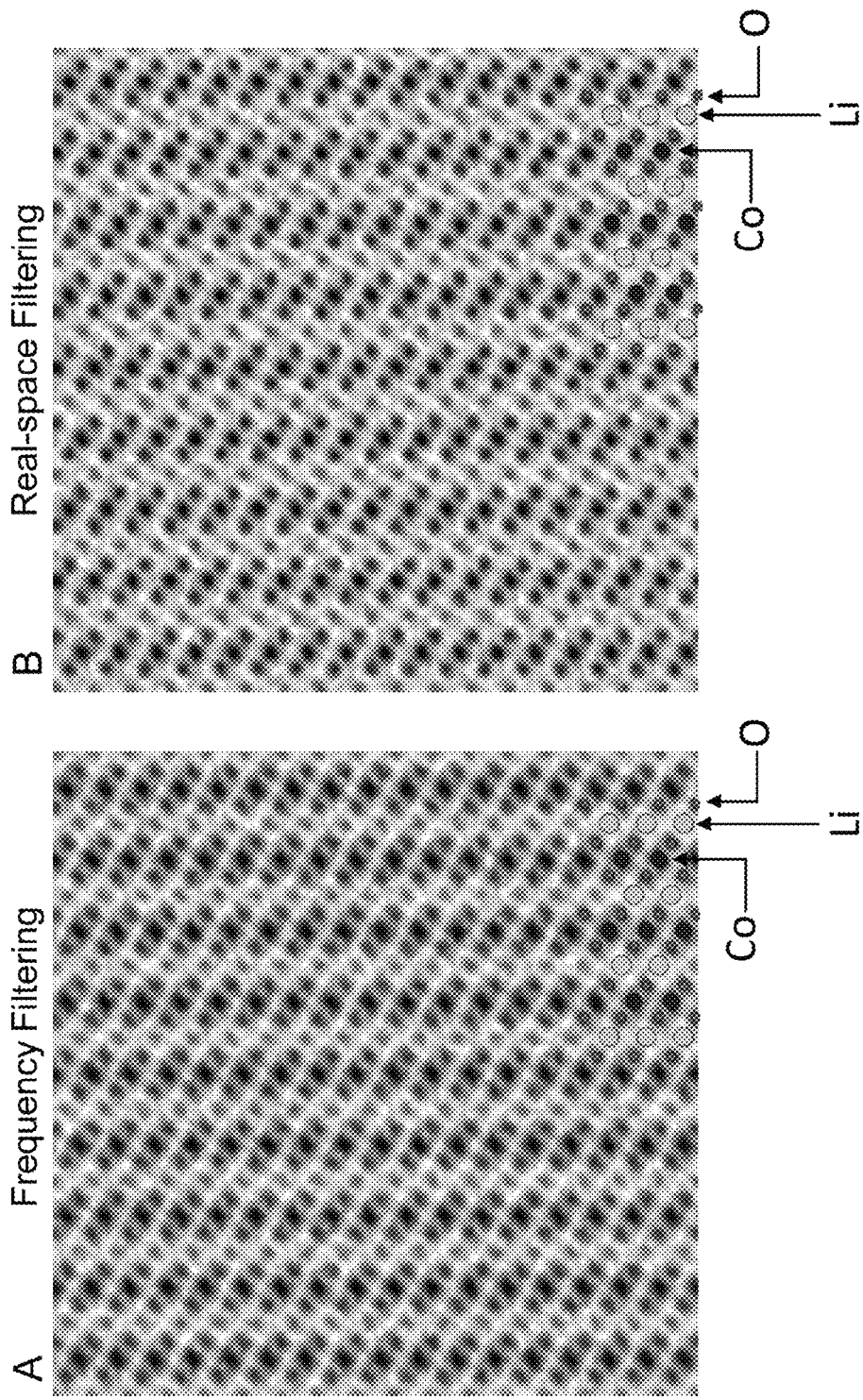
FIG. 10 is an example of a simulation image obtained by frequency filtering and a simulation image obtained by real-space filtering by the convolution using the approximate point spread function.

FIG. 10 shows simulation images of $LiCoO_2$ in the specimen S viewed from the [010] direction. The image A of FIG. 10 is a STEM image obtained by frequency filtering, and the image B of FIG. 10 is a STEM image obtained by real-space filtering by convolution with the approximate PSF. Here, the thickness of the specimen S is 10 nm, the accelerating voltage is 120 kV, and the convergence semi-angle is 30 mrad. The shot noise is introduced, and the dose amount is 25 e–/pixel=473 e–/Å$^2$. The approximate PSF used for real-space filtering has a size of 16 pixels square (16×16 pixels).

The STEM image A and the STEM image B in FIG. 10 show almost the same results, confirming that the lithium (Li) columns are clearly visualized under the lower dose condition. Accordingly, it can be said that real-space filtering by the convolution with the approximate PSF can be sufficiently used for real-time imaging.

In the above real-space filtering, the full PSF for one detection region is cropped into a rectangular approximate PSF. This indicates that the approximate PSF is defined by a rectangular window function. However, the approximate PSF used for the convolution in the embodiments may be defined not only by the rectangular window function but also by another window function such as a Hanning window function or a Hamming window function.

Figure 11:
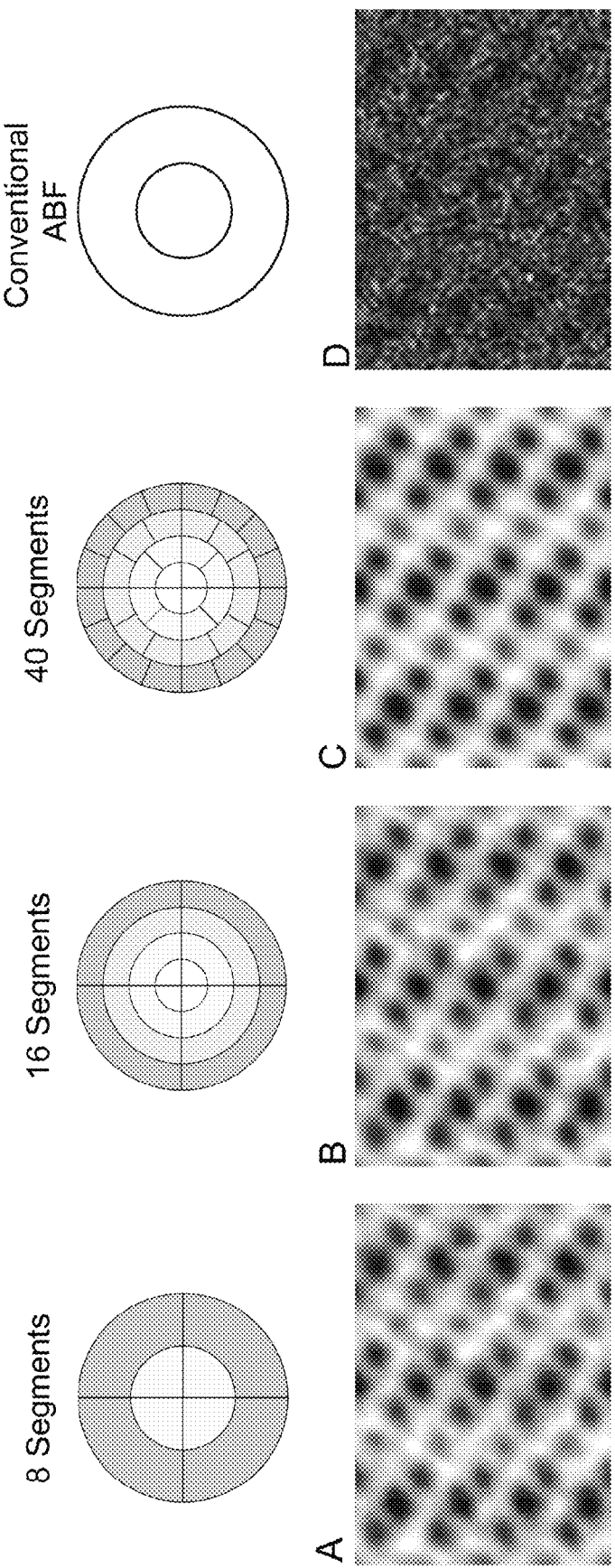
FIG. 11 is an example of images obtained using various segmented detectors having different number of segments and an image obtained by the conventional annular bright-field technique.

The observation method of the embodiments can be applied to various segmented detectors. FIG. 11 shows reconstructed STEM simulation images obtained by frequency filtering, which is the above post-processing, using various segmented detectors having different number of segments under a lower dose condition, and a STEM simulation image obtained using a conventional ABF detector, when the same specimen S made of $LiCoO_2$ is viewed from the [010] direction. Here, the thickness of the specimen S is 10 nm when viewed from the observation direction, the accelerating voltage is 120 kV, the convergence semi-angle is 30 mrad, and the dose amount is 10 e−/pixel.

An eight-segmented detector of FIG. 11 has eight fan-shaped detection regions including two segments in the radial direction and four segments in the azimuthal direction. A 16-segmented detector of FIG. 11 is the same as the segmented detector 105 shown in FIG. 2. A 40 segmented detector of FIG. 11 has 40 detection regions including four segments in the radial direction and four, eight, 12, and 16 segments in the azimuthal direction from an inner side to an outer side.

From FIG. 11, the atoms cannot be identified at all from the STEM image D obtained using the conventional ABF detector. On the other hand, the atoms can be clearly identified from the STEM images A, B, and C obtained using the eight-segmented detector, the 16-segmented detector, and the 40-segmented detector, respectively.

Figure 12:
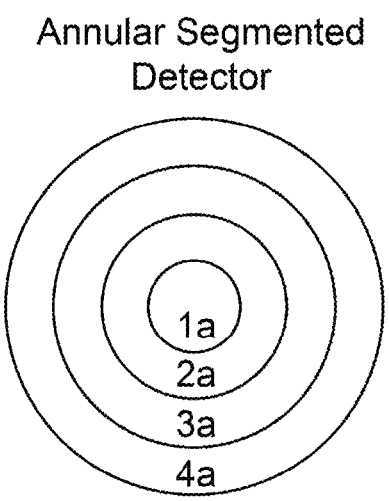
FIG. 12 is a schematic diagram illustrating a configuration of a segmented detector including circular and annular detection regions.

The segmented detector 105 of the embodiments and the segmented detectors shown in FIG. 11 have regions segmented in the radial direction and the azimuthal direction. Alternatively, for example, as shown in FIG. 12, a segmented detector having regions segmented only in the radial direction (a circular region 1a, and annular regions 2a, 3a, and 4a) may be employed.

Next, reference will be made to a relationship between shapes and arrangements of the detection regions of the segmented detector and the PCTF or the iPCTF.

By substituting Equation (2) into the PCTF $\beta_i(Q_p)$ for the i-th detection region expressed by Equation (11) and expanding the PCTF $\beta_i(Q_p)$, the resultant PCTF $\beta_i(Q_p)$ is expressed as in Equation (25).

$$\beta_i(Q_p) = \int A(k)D_i(k)[A(k-Q_p)\exp\{-i\chi(k-Q_p)+i\chi(k)\}-A(k+Q_p)\exp\{i\chi(k+Q_p)-i\chi(k)\}]dk \quad (25)$$

At this time, the detector response function $D_i(k)$ can be decomposed into a symmetric component $D_i^s(k)$ and an antisymmetric component $D_i^a(k)$ as in Equation (26).

$$D_i(k) = D_i^s(k) + D_i^a(k) \quad (26)$$

$$\text{where } D_i^s(k) = \frac{D_i(k) + D_i(-k)}{2},$$

$$D_i^a(k) = \frac{D_i(k) - D_i(-k)}{2}$$

That is, $D_i^s(k)$ and $D_i^a(k)$ show symmetry given by Equation (27) and antisymmetry given by Equation (28), respectively.

$$D_i^s(-k) = D_i^s(k) \quad (27)$$

$$D_i^a(-k) = -D_i^a(k) \quad (28)$$

From Equation (3) and Equation (5), the aperture function A(k) and the aberration function $\chi(k)$ are symmetric with respect to the origin as in Equation (29) and Equation (30), respectively.

$$A(-k) = A(k) \quad (29)$$

$$\chi(-k) = \chi(k) \quad (30)$$

Consequently, the PCTF $\beta_i(Q_p)$ is also decomposed into a symmetric component $\beta_i^s(Q_p)$ and an antisymmetric component $\beta_i^a(Q_p)$ as in Equation (31), corresponding to the symmetric component $D_i^s(k)$ and the antisymmetric component $D_i^a(k)$ of the detector response function $D_i(k)$.

$$\beta_i(Q_p) = \beta_i^s(Q_p) + \beta_i^a(Q_p) \quad (31)$$

Here, $\beta_i^s(Q_p)$ and $\beta_i^a(Q_p)$ are a real number component and a pure imaginary number component of $\beta_i(Q_p)$, respectively.

By substituting Equation (31) into Equation (17), the weight coefficient $W_i(Q_p)$ that yields the maximum of the SN ratio is given by Equation (32).

$$W_i(Q_p) = K(Q_p)\frac{\beta_i^s(Q_p) - \beta_i^a(Q_p)}{d_i} \quad (32)$$

As a result, the total PCTF $\beta_{tot}(Q_p)$ is given by Equation (33).

$$\beta_{tot}(Q_p) = \sum_{i=1}^{N} W_i(Q_p)\beta_i(Q_p) \quad (33)$$

$$= K(Q_p)\sum_{i=1}^{N}\frac{\beta_i^*(Q_p)\beta_i(Q_p)}{d_i} = K(Q_p)\sum_{i=1}^{N}\frac{|\beta_i^s(Q_p)|^2 + |\beta_i^a(Q_p)|^2}{d_i}$$

Here, when the i-th detection region of the segmented detector is disposed in a symmetrical shape with respect to the origin (a center of the detection surface), the detector response function $D_i(k)$ has only the symmetric component $D_i^s(k)$, and the antisymmetric component $D_i^a(k)$ is zero. Therefore, the PCTF $\beta_i(Q_p)$ has only the real number component. In contrast, when the i-th detection region is disposed in a non-symmetrical shape with respect to the origin, the PCTF $\beta_i(Q_p)$ has both the real number component and the pure imaginary number component.

Hence, the segmented detector in which each detection region is disposed in a non-symmetrical shape with respect to the origin is capable of obtaining a higher contrast STEM image than the segmented detector in which each detection region is disposed in a symmetrical shape with respect to the origin.

For example, each detection region of the segmented detector shown in FIG. 12 (the circular region 1a and the annular regions 2a, 3a, and 4a) is symmetric with respect to the origin, and thus the PCTF $\beta_i(Q_p)$ has only the real number component. In contrast, each of the detection regions 1 to 16 of the segmented detector 105 shown in FIG. 2 has a fan-shape which is non-symmetric with respect to the origin, and thus the PCTF $\beta_i(Q_p)$ has both the real number component and the pure imaginary number component. Therefore, using the segmented detector 105 shown in FIG. 2 makes it possible to achieve a higher contrast STEM image than using the segmented detector shown in FIG. 12.

As described above, since the PCTF $\beta_i(Q_p)$ depends on the shape and arrangement of each detection region of the segmented detector, it can be said that the shape and arrangement of each detection region affect the contrast of the acquired STEM image. The same holds true for the iPCTF $\beta_i^{thick}(Q_p)$.

According to the observation method of the embodiments described above, the STEM images are generated based on the detection results in the detection regions of the segmented detector, and the filters based on the weight coefficients $W_i(Q_p)$ that yield the maximum of the SN ratio (which is proportional to $|\beta_{tot}(Q_p)|/N_{tot}(Q_p)$)) are applied to the STEM images to generate a reconstructed image. Accordingly, it is possible to observe light elements in the specimen S with a high contrast even under lower dose conditions.

Especially in real-space filtering, the scanned area of the STEM image acquired from each detection region is convolved with the approximate PSF. With this feature, it is possible to perform real-time processing in the real space for generating the reconstructed image while scanning over the specimen S. Therefore, for example, it is possible to adjust the optical system such as aberration and adjust the observation conditions while scanning over the specimen S.

Furthermore, the observation method of the embodiments holds promise for a high-contrast observation of not only light elements such as lithium (Li) but also zeolite and metal-organic framework (MOF) which are porous materials.

Reference Sign List

100: scanning transmission electron microscope system
101: irradiation source
102: convergence lens
103: specimen holder
105: segmented detector
106: dark-field detector
107: detection unit
108A: first optical sensor unit
108B: second optical sensor unit
109: A/D converter
110: computer
111: control device
112: display
113: storage device
114: main memory
115: input device
116: communication interface
121: optical fiber bundle
EB: electron beam
S: specimen

The invention claimed is:

1. An observation method by means of a scanning transmission electron microscope for scanning an electron beam over a specimen and detecting electrons transmitted through the specimen to observe a structure in the specimen, the observation method comprising:
a step of acquiring results of detecting the electrons transmitted through the specimen using a segmented detector having a plurality of detection regions disposed in a bright-field area; and
a step of generating a plurality of segmented images based on the results of detecting the electrons in the plurality of detection regions, and applying filters determined based on a signal-to-noise ratio to the plurality of segmented images to generate a reconstructed image, wherein
the signal-to-noise ratio is proportional to an absolute value of a total phase contrast transfer function normalized by a noise level, the total phase contrast transfer function being defined by product-sum operation of phase contrast transfer functions expressed by complex numbers and weight coefficients for the plurality of detection regions, and
the filters for the plurality of detection regions are determined based on the weight coefficients that yield a maximum of the signal-to-noise ratio.

2. The observation method according to claim 1, wherein the weight coefficients that yield the maximum of the signal-to-noise ratio are uniquely determined based on background levels and a complex conjugate of the phase contrast transfer functions.

3. The observation method according to claim 1, wherein the step of generating the reconstructed image includes:
performing Fourier transform on the plurality of segmented images to obtain a plurality of Fourier images;
performing product-sum operation of the plurality of Fourier images and the weight coefficients to obtain a total Fourier image; and
performing inverse Fourier transform on the total Fourier image to obtain the reconstructed image.

4. The observation method according to claim 1, wherein the step of generating the reconstructed image includes convolving scanned areas of the plurality of segmented images with window functions to generate the reconstructed image, each of the window functions being obtained by cropping a point spread function into a portion of the point spread function, the point spread function being defined by inverse Fourier transform of each of the weight coefficients.

5. The observation method according to claim 1, wherein the phase contrast transfer functions for the plurality of detection regions depend on shapes and arrangements of the plurality of detection regions.

6. A scanning transmission electron microscope system for scanning an electron beam over a specimen and detecting electrons transmitted through the specimen to observe a structure in the specimen, the scanning transmission electron microscope system comprising:
an irradiation source configured to generate the electron beam;
a convergence device configured to converge the electron beam generated by the irradiation source onto the specimen;
a detection unit including a segmented detector having a plurality of detection regions disposed in a bright-field area and configured to detect the electrons transmitted through the specimen for each of the plurality of detection regions; and
a computer configured to generate a plurality of segmented images based on results of detecting the electrons in the plurality of detection regions, and apply filters determined based on a signal-to-noise ratio to the plurality of segmented images to generate a reconstructed image, wherein
the signal-to-noise ratio is proportional to an absolute value of a total phase contrast transfer function normalized by a noise level, the total phase contrast transfer function being defined by product-sum operation of phase contrast transfer functions expressed by complex numbers and weight coefficients for the plurality of detection regions, and the filters for the plurality of detection regions are determined based on the weight coefficients that yield a maximum of the signal-to-noise ratio.

7. A non-transitory computer readable medium storing a program for executing an observation method by means of a scanning transmission electron microscope, the program causing a computer to execute:

a step of acquiring results of detecting electrons transmitted through a specimen using a segmented detector having a plurality of detection regions disposed in a bright-field area; and a step of generating a plurality of segmented images based on the results of detecting the electrons in the plurality of detection regions, and applying filters determined based on a signal-to-noise ratio to the plurality of segmented images to generate a reconstructed image, wherein the signal-to-noise ratio is proportional to an absolute value of a total phase contrast transfer function normalized by a noise level, the total phase contrast transfer function being defined by product-sum operation of phase contrast transfer functions expressed by complex numbers and weight coefficients for the plurality of detection regions, and the filters for the plurality of detection regions are determined based on the weight coefficients that yield a maximum of the signal-to-noise ratio.

\* \* \* \* \*